United States Patent [19]

Forouhi et al.

[11] Patent Number: 5,510,646
[45] Date of Patent: Apr. 23, 1996

[54] METAL-TO-METAL ANTIFUSE WITH IMPROVED DIFFUSION BARRIER LAYER

[75] Inventors: Abdul R. Forouhi; Iton Wang, both of San Jose, Calif.

[73] Assignee: Actel Corporation, Sunnyvale, Calif.

[21] Appl. No.: 247,243

[22] Filed: Jun. 10, 1993

Related U.S. Application Data

[63] Continuation of Ser. No. 842,872, Feb. 26, 1992, abandoned.

[51] Int. Cl.$^6$ ............................ H01L 29/04; H01L 29/00
[52] U.S. Cl. ........................ 257/530; 257/528; 257/529; 257/530
[58] Field of Search ................ 357/51, 71; 257/50, 257/528, 529, 530

[56] References Cited

U.S. PATENT DOCUMENTS

| | | | |
|---|---|---|---|
| 4,651,409 | 3/1987 | Ellsworth et al. | 29/576 B |
| 4,748,490 | 5/1988 | Hollingsworth | 357/51 |
| 4,796,075 | 1/1989 | Whitten | 357/51 |
| 4,822,753 | 4/1989 | Pintchovski | 437/192 |
| 4,823,181 | 4/1989 | Mohsen et al. | 257/51 |
| 4,847,732 | 7/1989 | Stopper et al. | 361/395 |
| 4,870,302 | 9/1989 | Freeman | 307/465 |
| 4,899,205 | 2/1990 | Hardy et al. | 357/51 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 257/51 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hardy et al. | 357/51 |
| 5,166,556 | 11/1992 | Hsu et al. | 307/465 |
| 5,171,715 | 12/1992 | Husher et al. | 437/195 |
| 5,173,449 | 12/1992 | Lorenzen et al. | 437/192 |
| 5,194,759 | 3/1993 | Ei-Ayat et al. | 307/202.1 |
| 5,196,724 | 3/1993 | Gordon et al. | 257/530 |
| 5,233,217 | 8/1993 | Dixit et al. | 257/530 |
| 5,266,829 | 11/1993 | Hardy et al. | 257/530 |
| 5,272,101 | 12/1993 | Forouhi et al. | 437/44 |
| 5,272,666 | 12/1993 | Tsang et al. | 365/96 |
| 5,290,734 | 3/1994 | Boardman et al. | 437/195 |
| 5,300,456 | 4/1994 | Tigelaar et al. | 437/195 |
| 5,308,795 | 5/1994 | Hawley et al. | 437/195 |
| 5,322,812 | 6/1994 | Dixit et al. | 437/60 |

FOREIGN PATENT DOCUMENTS

| | | | |
|---|---|---|---|
| 0455414 | 4/1991 | European Pat. Off. | H01L 23/525 |
| 9220109 | 4/1992 | European Pat. Off. | H01L 45/00 |
| 8700969 | 7/1986 | WIPO | H01L 23/52 |
| 8702827 | 10/1986 | WIPO | H01L 27/24 |
| 9213359 | 1/1992 | WIPO | H01L 21/285 |
| 9303499 | 7/1992 | WIPO | H01L 23/525 |

*Primary Examiner*—Rolf Hille
*Assistant Examiner*—Valencia Martin Wallace
*Attorney, Agent, or Firm*—D'Alessandro & Ritchie

[57] ABSTRACT

A metal-to-metal antifuse comprises a lower electrode comprising a first metal layer in an integrated circuit, a first barrier layer formed from a layer of TiW:N disposed over the lower electrode, a layer of antifuse material formed from amorphous silicon over the first barrier layer, a second barrier layer formed from a layer of TiW:N disposed over the layer of antifuse material, said second barrier layer, and an upper electrode over the second barrier layer, the upper electrode comprising a second metal layer in the integrated circuit.

2 Claims, 2 Drawing Sheets

METAL-TO-METAL ANTIFUSE WITH IMPROVED DIFFUSION BARRIER LAYER

This application is a continuation of application Ser. No. 07/842,872, filed Feb. 26, 1992, which is now abandoned.

BACKGROUND OF THE INVENTION

1. Field of the Invention

The present invention relates to user-programmable antifuse structures. More particularly, the present invention relates to a metal-to metal antifuse structure with improved immunity to electrode diffusion through a barrier layer interposed between the electrodes and the antifuse material. The present invention relates to processing methods, in general, and the selection of diffusion barrier materials, in particular, to ensure manufacturability of products containing metal/a-Si/metal antifuses

2. The Prior Art

Antifuses employing amorphous silicon antifuse material are known in the prior art. Since such antifuses are often deployed between metal layers in an integrated circuit, they may employ materials such as aluminum as the antifuse electrodes. Traditionally, several methods have been employed to form barrier layers between the electrodes and the amorphous silicon antifuse material. A thin layer of deposited silicon dioxide has been used. If this layer is too thin, it will not be an effective barrier, and if it is too thick, it will appreciably raise the programming voltage of the antifuse. Control of the thickness of this layer is a difficult task. Alternatively, the lower electrode has been formed from TiW itself. However, this layer cannot be used as the bottom layer of the antifuse and as an interconnect layer. A silicon nitride layer has also been deposited over the TiW layer. If this layer is too thin, it will not be an effective barrier, and if it is too thick, it will appreciably raise the programming voltage of the antifuse.

While titanium-tungsten (TiW) has been used as diffusion barrier for fabrication of antifuses comprising an amorphous silicon antifuse material sandwiched between two metal layers, TiW is not an effective diffusion barrier; especially for use in process technologies which employ alloy temperatures of about 400° C. to 450° C. or higher, because aluminum diffuses through the barrier layer to the amorphous silicon and changes its conductive properties. In addition Ti or W atoms may also diffuse into the amorphous silicon antifuse layer, altering its conductive properties.

BRIEF DESCRIPTION OF THE INVENTION

According to the present invention, a metal-to-metal antifuse structure includes a diffusion barrier, comprising a layer of nitrided titanium tungsten (TiW:N), interposed between the metal layers and the amorphous silicon antifuse material. According to a presently preferred embodiment of the invention, the TiW:N layer may be formed in situ by reactive ion sputtering of TiW in the presence of nitrogen. Alternatively, the TiW layer may be first formed and then later exposed to an ambient of nitrogen under conditions which will form a nitrided layer at the surface of the TiW layer.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Metal-to-metal antifuses have been gaining in popularity for some time. Care must be taken to prevent the metal material from which the antifuse electrodes are fabricated from diffusing into the antifuse material in order to avoid reliability problems with antifuses which are to remain unprogrammed. This concern is especially acute when amorphous silicon is employed as the antifuse material.

Figure 1A:
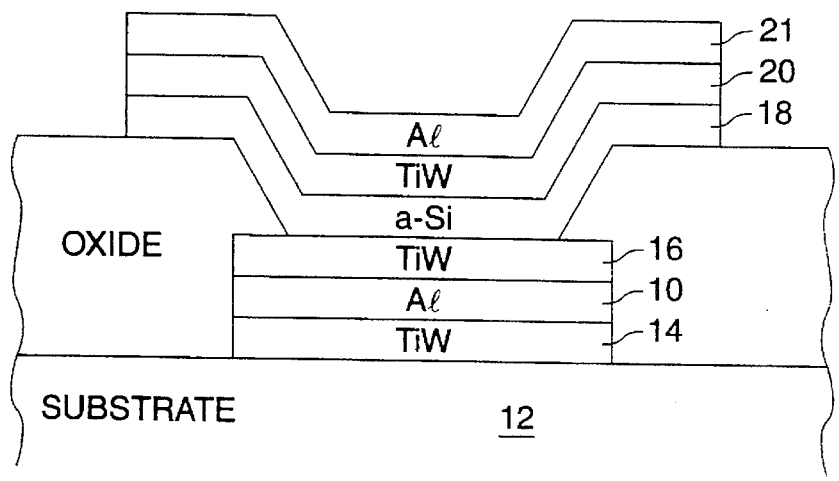
FIG. 1a is a diagram of a cross section of a prior art antifuse incorporating a TiW diffusion barrier layer.

FIG. 1a is a cross sectional view of a prior art metal-to-metal antifuse structure. The prior art metal-to-metal antifuse is shown comprising a lower electrode 10 formed from a metal layer in an integrated circuit disposed above and separated from the surface of a semiconductor substrate 12, which may include other structures, by a layer 14 which may be a barrier layer or an insulating layer. A lower TiW barrier layer 16 is interposed between lower electrode 10 and a layer of amorphous silicon antifuse material 18. An upper TiW barrier layer 20 is interposed between the antifuse material 18 and the upper electrode 22, formed from another metal layer in the integrated circuit.

Figure 1B:
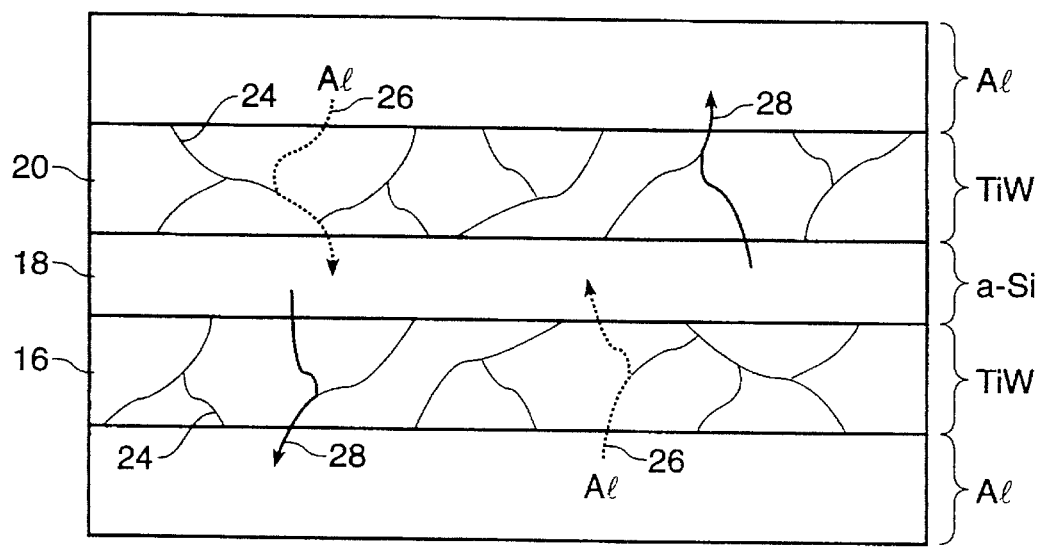
FIG. 1b is a schematic representation of a portion of the cross section of the prior art antifuse of FIG. 1a, showing the interdiffusion of silicon and aluminum through TiW grain boundaries.

The interdiffusion of Si and Al through TiW grain boundaries is a well-understood phenomenon and is presented schematically in FIG. 1b. The grain boundaries are represented by lines 24. The dotted arrows 26 represent the path of aluminum atoms to the amorphous silicon and the solid arrows 28 represent the path of silicon atoms to the aluminum through the TiW grain boundaries 24. Because of this diffusion characteristic, TiW is not an effective diffusion barrier for use in antifuse applications. In addition, Ti or W atoms may also diffuse into the amorphous silicon antifuse layer. This especially true in process technologies which employ alloy temperatures of about 400° C. to 450° C. or higher, because the high temperatures enhance aluminum diffusion through the barrier layer to the amorphous silicon.

Figure 2:
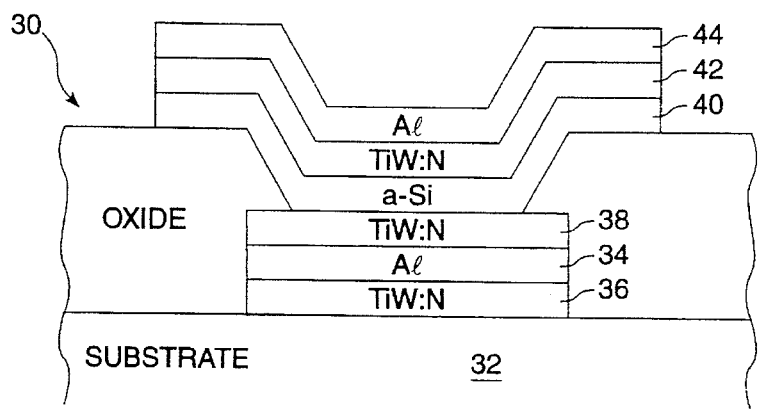
FIG. 2 is a diagram of a cross section of an antifuse fabricated according to the present invention employing a TiW:N diffusion barrier layer.

According to the present invention, a metal-to-metal antifuse having an improved barrier layer to prevent metal diffusion into the antifuse material layer is disclosed. Referring now to FIG. 2, a cross sectional view of a metal-to-metal antifuse structure fabricated according to the principles of the present invention is presented. The antifuse structure 30 of the present invention may be incorporated into an integrated circuit fabricated on a semiconductor substrate 32. Those of ordinary skill in the art will recognize that, for some applications, substrate 32 may be fabricated from a material other than a semiconductor material, such as a ceramic material or other insulator, or may be actually a layer formed over the base substrate material..

The lower electrode 34 of antifuse structure 30 preferably comprises a portion of a metal interconnect layer already employed in the integrated circuit, and may be formed from a metal such as aluminum or from other metals or combinations of metals and other materials commonly employed for integrated circuit interconnect layers and may typically have a thickness of about between 2,500 and 10,000 angstroms. Lower electrode 34 is shown disposed over an insulating layer 36, covering the substrate and any other intervening structures placed thereon (not shown). As in a conventional integrated circuit process, the layer comprising lower electrode 34 is formed on the top of insulating layer 36 and then appropriately patterned using conventional semiconductor processing techniques.

Next, a lower barrier layer 38 is formed over lower electrode 34. According to a presently preferred embodiment of the invention, lower barrier layer 38 comprises a layer of TiW:N having a thickness of about between 500 and 2,000 angstroms. According to the present invention, the TiW:N barrier films may be produced by a reactive sputtering process, in which $N_2$ gas is introduced into the noble gas ambient in the reaction chamber during the TiW deposition. With a $N_2$/Ar gas flow ratio of about ⅓, i.e., 50 sccm $N_2$ and 150 sccm Ar, a TiW:N film having a resistivity of about 240 µΩ-cm can be produced. As the gas flow ratio is increased, the resistivity of the resulting TiW:N film increases and its diffusion barrier properties improve. Nevertheless, for circuit considerations, it may not be desirable to produce TiW:N films with resistivities exceeding about 400 µΩ-cm.

Alternatively, an already grown TiW film may be annealed in an atmosphere of pure $N_2$ or forming gas (90% $N_2$ and 10% $H_2$) at a temperature of about between 300° C. to 450° C. for a period of about 30 minutes. This process results in formation of TiW:N barrier films having barrier and electrical characteristics similar to those produced by in situ formation of TiW:N.

Next, an antifuse material layer 40, comprising amorphous silicon or other suitable material or materials formed using conventional processing techniques, is placed over the lower barrier layer 38. The thickness chosen for antifuse material layer 40 will depend on the parameters desired for the finished antifuse, such as programming voltage, final resistance, and capacitance in the unprogrammed state. Those of ordinary skill in the art will recognize that tradeoffs between these parameters will need to be evaluated to choose a thickness for this layer. Making such tradeoffs are well within the level of ordinary skill in the art.

After the formation of antifuse layer 40, an upper barrier layer 42 is formed on its surface. Upper barrier layer 42 may be formed from the same material and in the same manner as lower barrier layer 38.

Finally, an upper electrode 44 is formed over the surface of upper barrier layer 42. Upper electrode 42 of antifuse structure 30 preferably comprises a portion of another metal interconnect layer already employed in the integrated circuit, and may be formed from a metal such as aluminum or from other metals or combinations of metals and other materials commonly employed for integrated circuit interconnect layers and may typically have a thickness of about between 2,500 and 10,000 angstroms.

Figure 3A:
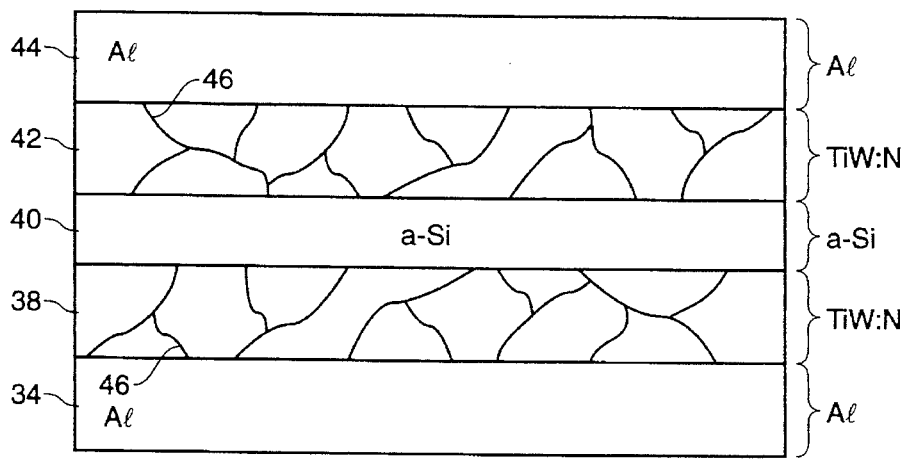
FIGS. 3a and 3b are schematic representations of two variations of cross-sections of an antifuse according to the present invention incorporating a TiW:N diffusion barrier layer, showing that TiW:N is an effective diffusion barrier.
Figure 3B:
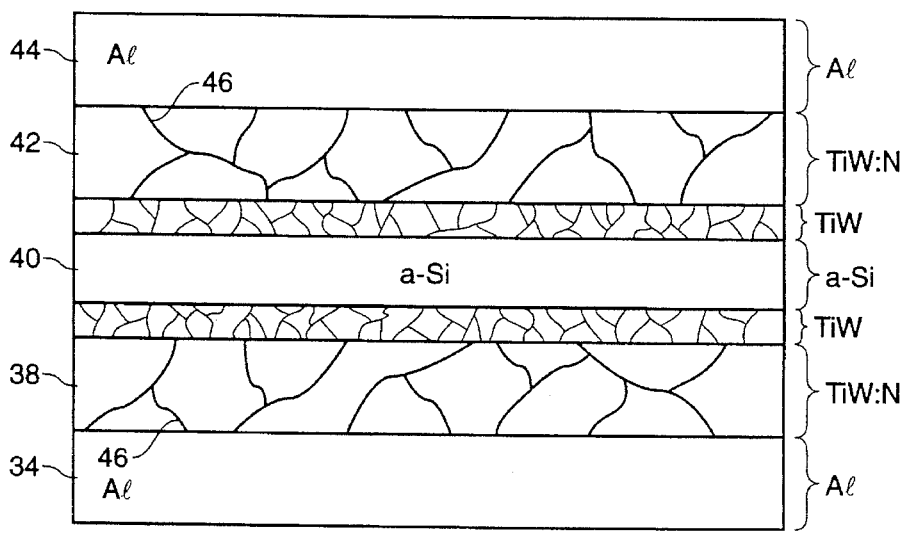

TiW:N barrier layers produced according to the teachings of present invention possess the advantageous properties of TiW (including good adhesion promotion, and low sheet resistance), and, at the same time provide a more effective diffusion barrier to protect the antifuse layer from interdiffusion of Si and Al. The effectiveness of Tiw:N as a diffusion barrier is due to the presence of TiWN precipitates at Tiw:N grain boundaries, which block interdiffusion of Si and Al through grain boundaries. This is shown schematically in FIGS. 3a and 3b, where the dark lines 46 represent TiWN precipitates which act to plug the grain boundaries of the TiW:N film, thus effectively blocking interdiffusion of metal into the amorphous silicon antifuse layer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A metal-to-metal antifuse comprising;

a lower electrode comprising a portion of a first metal interconnect layer in an integrated circuit;

a first barrier layer disposed over said lower electrode, said first barrier layer formed from a layer of TiW:N;

a layer of antifuse material disposed over said first barrier layer, said layer of antifuse material formed from amorphous silicon;

a second barrier layer disposed over said layer of antifuse material, said second barrier layer formed from a layer of TiW:N;

said first and second barrier layers acting to limit a leakage current in said antifuse to a value less than about $1 \times 10^{-8}$ A/µm$^2$ at 5 volts: and an upper electrode disposed over said second barrier layer, said upper electrode comprising a portion of a second metal layer in said integrated circuit.

2. An antifuse structure comprising first and second electrodes separated by a layer of antifuse material, at least one of said first and second electrodes comprising a metal layer, said antifuse further including as barrier layer comprising a layer of TiW:N, said barrier layer disposed between said layer of antifuse material and the one of said first and second electrodes which comprises a metal layer, said. barrier layer acting to limit a leakage current in said antifuse to a value less than about, $1 \times 10^{-8}$ A/µm at 5 volts.

* * * * *

UNITED STATES PATENT AND TRADEMARK OFFICE
CERTIFICATE OF CORRECTION

PATENT NO. : 5,510,646
DATED : April 23, 1996
INVENTOR(S) : Abdul R. Forouhi, et. al.

It is certified that error appears in the above-indentified patent and that said Letters Patent is hereby corrected as shown below:

```
Column 1, line 18, after "antifuses" insert --.--.
Column 1, line 32, before "However" insert two blank spaces.
Column 2, line 40, after "This" insert --is--.
Column 3, line 22, after the second "the" delete the extra spaces.
Column 3, line 24, delete the indent before "50".
Column 3, line 25, delete the indent before "resistivity".
Column 3, line 26, delete the indent before "gas".
Column 3, line 27, delete the indent before "TiW:N".
Column 3, line 28, delete the indent before "improve".
Column 3, line 29, delete the indent before "not".
Column 3, line 30, delete the indent before "exceeding".
Column 4, line 44, after "said" delete ".".
```

Signed and Sealed this

Twenty-second Day of October, 1996

Attest:

BRUCE LEHMAN

*Attesting Officer*          *Commissioner of Patents and Trademarks*